(12) United States Patent
Jun-Lin

(10) Patent No.: US 6,707,717 B2
(45) Date of Patent: Mar. 16, 2004

(54) CURRENT SENSE AMPLIFIER WITH DYNAMIC PRE-CHARGE

(75) Inventor: Yeh Jun-Lin, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 17 days.

(21) Appl. No.: 10/214,120

(22) Filed: Aug. 8, 2002

(65) Prior Publication Data

US 2003/0133328 A1 Jul. 17, 2003

(30) Foreign Application Priority Data

Jan. 16, 2002 (TW) ........................................ 91100633 A

(51) Int. Cl.$^7$ ............................................... G11C 16/06
(52) U.S. Cl. ............................... 365/185.21; 365/185.2; 365/195.25
(58) Field of Search ...................... 365/185.21, 185.2, 365/185.25, 203

(56) References Cited

U.S. PATENT DOCUMENTS

| | | | |
|---|---|---|---|
| 4,713,797 A | 12/1987 | Morton et al. | 365/208 |
| 4,943,948 A * | 7/1990 | Morton et al. | 365/185.21 |
| 5,258,669 A | 11/1993 | Nakashima | 307/530 |
| 5,386,158 A | 1/1995 | Wang | 327/51 |
| 6,438,051 B1 * | 8/2002 | Fifield et al. | 365/207 |

* cited by examiner

*Primary Examiner*—Huan Hoang
(74) *Attorney, Agent, or Firm*—Bacon & Thomas, PLLC

(57) ABSTRACT

A current sense amplifier with dynamic pre-charge is proposed. There is a storage unit having a sense line, a voltage amplifier for generating a first output signal depending on the sense line, a first current mirror for generating a first current depending on the first output signal, a second current mirror for generating a second current depending on a reference storage unit, and a pre-charge circuit for generating a charge up signal on the sense line to pre-charge the sense line to an operation current level depending on the first output signal, the second current and a clock pulse so as to directly detect a data in the storage unit during detecting the sense line.

10 Claims, 5 Drawing Sheets

CURRENT SENSE AMPLIFIER WITH DYNAMIC PRE-CHARGE

FIELD OF THE INVENTION

The present invention is relative to a current sense amplifier and more particularly to the current sense amplifier with dynamic pre-charge and current biasing method.

BACKGROUND OF THE INVENTION

A memory array consists of plurality of rows of word-lines and a plurality of column of bit-lines. The bit-lines have heavily loaded with parasitic capacitor especially in high density memory array. During read operation, either from standby or normal read access, the parasitic capacitor of the bit-line will be brought to the operating voltage levels of the sense amplifier in order to generate an output indicative of the state of the memory cell being read. But it is hard to control the pre-charge circuit to the desired operating point. If the pre-charge circuit is too strong, the bit-line and the sense line voltage will be overshoot. On the other hand, if the pre-charge circuit is too weak, the pre-charge time will be very long and the bit-line voltage will be under the desired target. Both ways will lead to a very long bit-line recovery time before the sense amplifier can sense the correct state of the memory cell being read.

In this approach, it adopts a new method and circuit for the pre-charge operation. This circuit can quickly pre-charge the bit-line and the sense line being accessed to the operating point. The operating point has self convergence capability in the period of the applied external pulse. Hence it can eliminate the long bit-line recovery time due to the wrong bit-line pre-charge level and reduce the read access time. This pre-charge circuit accompanies with the voltage amplifier and the current mirror. It can provide a new method to bias the current through the current mirror to the desired operating current. Hence It can increase the speed of this current sense amplifier.

Please refer to attachment 1 showing the prior art U.S. Pat. No. 4,713,797. It is a current mirror sense amplifier for a nonvolatile memory. In this prior art, the heavy parasitic capacitor of the bit-line is charged up only by the voltage amplifier itself. Hence the read speed will be limited by the bit-line recovery time due to the weak pull up capability of the voltage amplifier.

Please refer to attachment 2 showing the prior art U.S. Pat. No. 5,258,669. It is a current sense amplifier circuit. In this circuit the bit-lines of the memory cells for the read access process are supplied with a current from the voltage amplifier in addition with the current from a pre-charge circuit in a predetermined short period of time in response to start of the read access.

In this prior art, the bit-line being accessed can be pre-charged quickly, but the bit-line voltage level cannot be controlled to the desired voltage level of the sense amplifier because only pull-up NMOS is being used for the pre-charge operation. It is hard to optimize between pre-charge speed without overshoot. It is difficult to control the pre-charge level (to the operating point of the sense amplifier) so the read access speed cannot be optimized.

Please refer to attachment 3,4 showing the prior art 3 (U.S. Pat. No. 5,386,158). It is also a current sense amplifier. In this approach, the pre-charge circuit is self-controlled by the voltage amplifier and no need for pulse control. There are two tradeoffs of this prior art:

1. The time taken for the pre-charge circuit to pre-charge near the VL level is slow because the pre-charge circuit is weak. Hence the amplifier is easily bias to sense the VL level rather than the VH level.
2. The time taken for the voltage amplifier circuit to charge the high parasitic capacitor in the bit-line from the level of VL to VH is quite long because the current supplied by the voltage amplifier alone is weak.
3. The pre-charge circuit cannot accurately pre-charge the bit-line level to the VL as expected due to the Vt difference of the transistors in the pre-charge circuit and the voltage amplifier. This effect makes the first tradeoff even worse.

SUMMARY OF THE INVENTION

The objective of the present invention is to overcome the issues that mentioned in the existing conventional current sense amplifiers (Prior arts). This invention can provide a fast pre-charge current path with clamping mechanism (Both pull up and pull down) to avoid the overshoot of the bit-line voltage during pre-charge period.

According to the present invention, a current sense amplifier with dynamic pre-charge comprises: a storage unit having a sense line; a voltage amplifier for generating a first output signal depending on the sense line; a first current mirror for generating a first current depending on the first output signal; a second current mirror for generating a second current depending on a reference storage unit; and a pre-charge circuit for generating a charge up signal on the sense line to pre-charge the sense line to an operation current level depending on the first output signal, the second current and a clock pulse so as to directly detect a data in the storage unit during detecting the sense line.

In accordance with one aspect of the present invention, the storage unit is a memory cell.

In accordance with one aspect of the present invention, the sense line electrically connects to a bit line of the memory cell.

In accordance with one aspect of the present invention, it further comprises a comparison circuit for comparing the first current and the second current and outputting a data of the storage unit depending on the first current and the second current.

In accordance with one aspect of the present invention, the second current is a reference current and the reference storage unit is a reference memory cell.

According to the present invention, a current sense amplifier with dynamic pre-charge comprises: a storage unit having a sense line; a voltage amplifier for generating a first output signal; a first current mirror for generating a first current depending on the first output signal; a pre-charge circuit for generating a charge up signal on the sense line to pre-charge the sense line to an operation current level depending on the first output signal, an internal reference current and a clock pulse so as to directly detect a data in the storage unit during detecting the sense line.

In accordance with one aspect of the present invention, the storage unit is a memory cell.

In accordance with one aspect of the present invention, the sense line electrically connects to a bit line of the memory cell.

In accordance with one aspect of the present invention, it further comprises a comparison circuit for comparing the first current and the second current and outputting a data in the storage unit depending on the first current and the second current.

In accordance with one aspect of the present invention, the internal reference current is generated from a reference storage unit of the pre-charge circuit.

According to the present invention, a method for biasing a current sense amplifier comprises step of using a pre-charge circuit to set the current sense amplifier near an operating point of the current being sensed in addition with fast sense line pre-charge.

In accordance with one aspect of the present invention, the current is a memory cell current.

The present invention may best be understood through the following description with reference to the accompanying drawings, in which:

DETAILED DESCRIPTION OF THE PREFERRED EMBODIMENT

The bit-line being accessed during read operation can easily converge to the operating point of the current sense amplifier. Further more, because of the size matching mechanism of the pull up and pull down circuit in the pre-charge circuit, the current sense amplifier can be biased to the operation-current level (operation-current level means the level of current operating point). So that right after the pre-charge pulse, the current sense amplifier can immediately sense the current of the cell being accessed.

Figure 1:
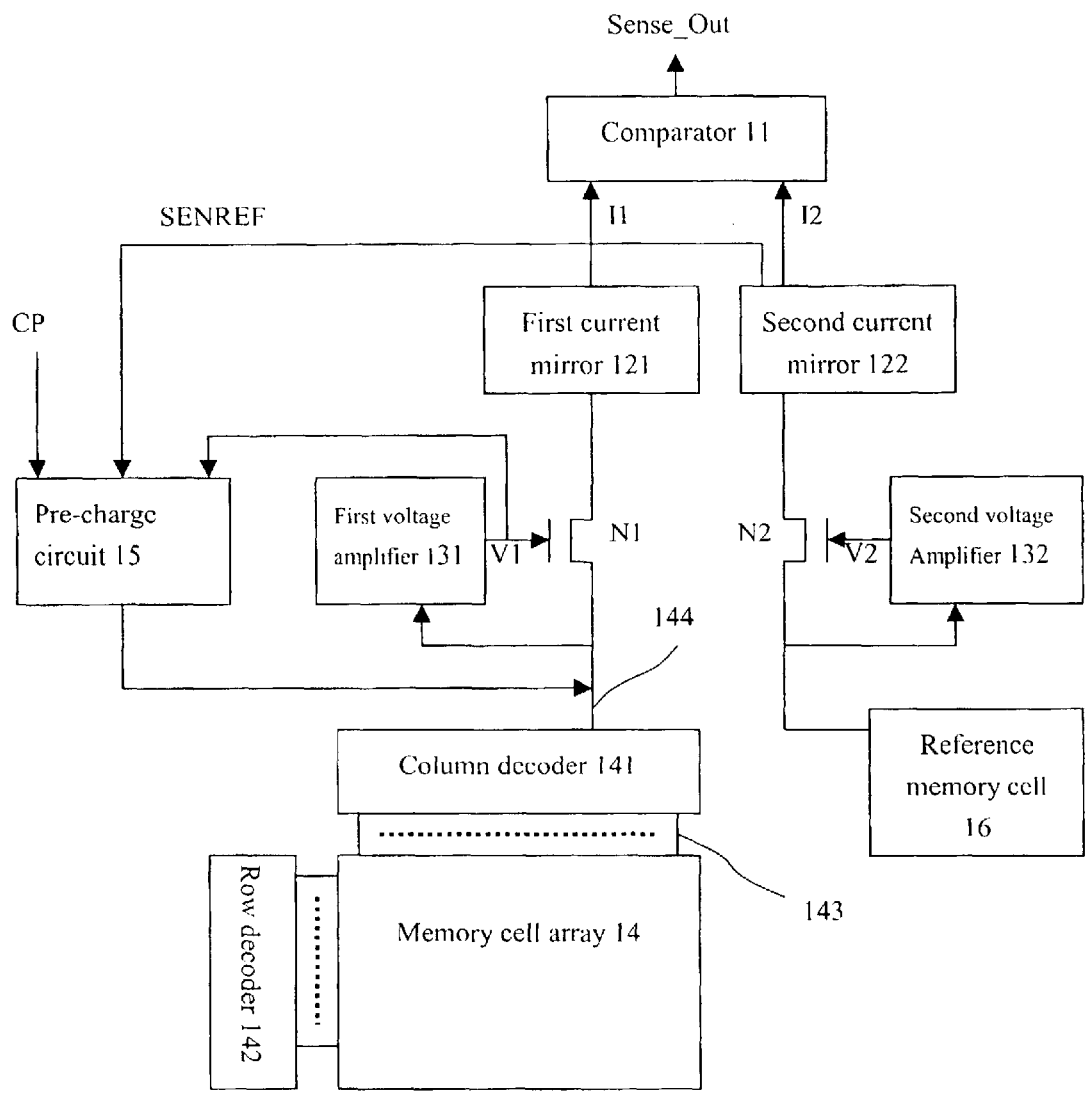
FIG. 1 is a block diagram according to the present invention.

The following is the detail description about this invention:

Refer to FIG. 1. It is the block diagram of the present invention. This current sense amplifier circuit is used with a memory array 14 comprising of plurality of memory cells. The memory cells are arranged in a plurality of rows and columns. The plurality of the columns (Bit-lines 143) is coupled to the sense line 144 of the current sense amplifier by the column decoder 141. This sense line 144 is the input to the first voltage amplifier 131 and the drain of transistor N1 (NMOS). It also coupled to the pre-charge circuit 15.

At the beginning of read operation, a predetermined pulse signal CP is coupled to the pre-charge circuit 15. During this pulse period this pre-charge circuit 15 is "on" and starts to charge up this highly capacitive bit-line 143 being accessed and the sense line 144.

Figure 2:
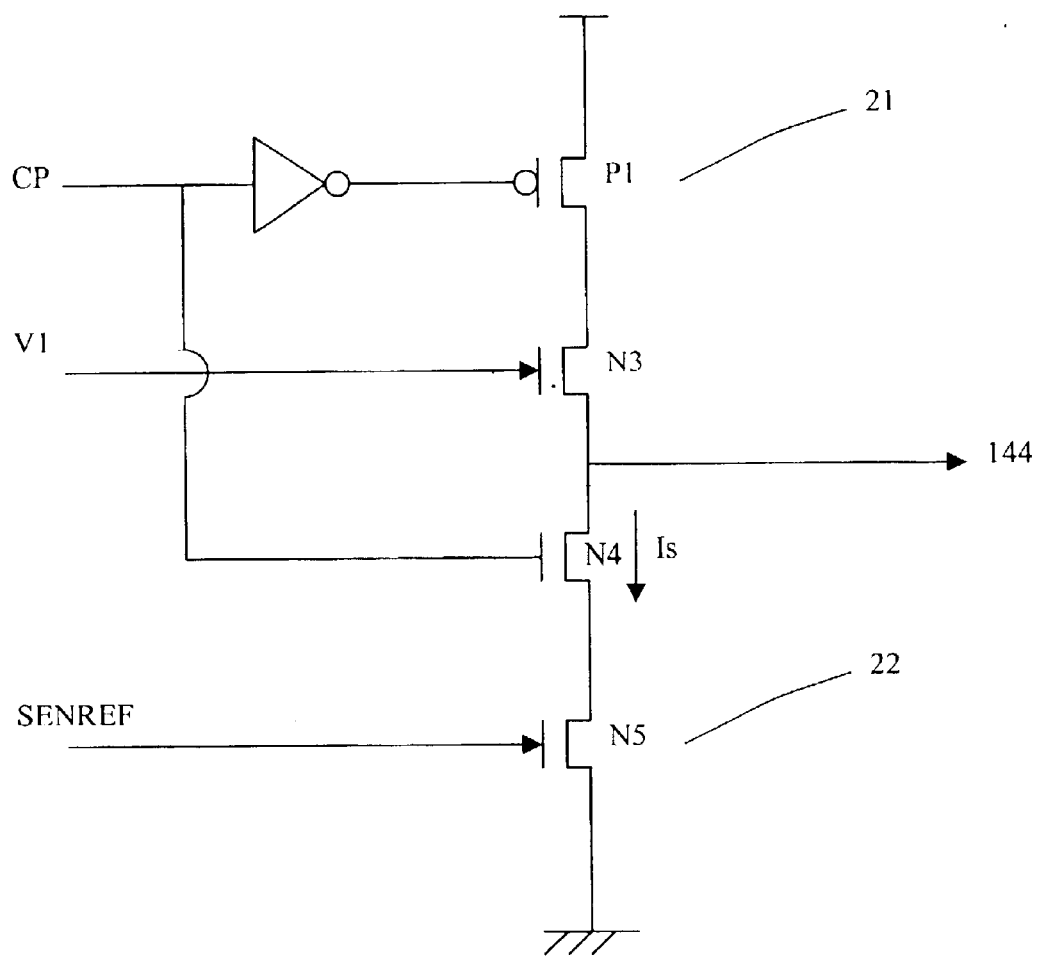
FIG. 2 is a pre-charge circuit 1 according to the present invention.

Refer to FIG. 2. The pull up path 21 and the pull down path 22 form a clamping mechanism and hence avoid the sense line 144 from overshoot.

The transistor N3 of the pull up path 21 is selected to be a multiple of the size of transistor N1 and this size depends on the desired pre-charge speed, power budget and the value of the parasitic bit-line capacitor.

Basically transistor N3 is much larger than transistor N1 (For example 10 times).

The pull down path 22 is a current source. This current source Is is a multiple of the second current I2 coupled from the second current mirror 122. The ratio of the size of the pull up transistor N3 with the size of the transistor N1 determines this current source Is.

So most of the current in the pull down current source (Is) will flow through the N3 of the pull up path 21 in the pre-charge circuit 15 and only the desired operating current I1 will flow through N1 to the first current mirror 121. So that, the first current mirror 121 is biased on its current operating point.

The following is an example for the current source (Is):

Suppose the size N3:N1=10:1 (As proposed above)

The second current=I2

If we want to bias the current I1 to reach a stable current after the pre-charge period=0.5×I2, $$I1=0.5\times I2 \text{ and } I3=0.5\times 10\times I2.$$

After the pre-charge period, the pre-charge circuit 15 is switched off and the sense line 144 will sense the current from the cell being access. So that, the first voltage amplifier 131 will output the first output signal V1 to the gate of N1. And, the first current mirror 121 generates a first current I1 in response with the first output signal V1. Then this current I1 is supplied to the comparator 11.

Figure 3:
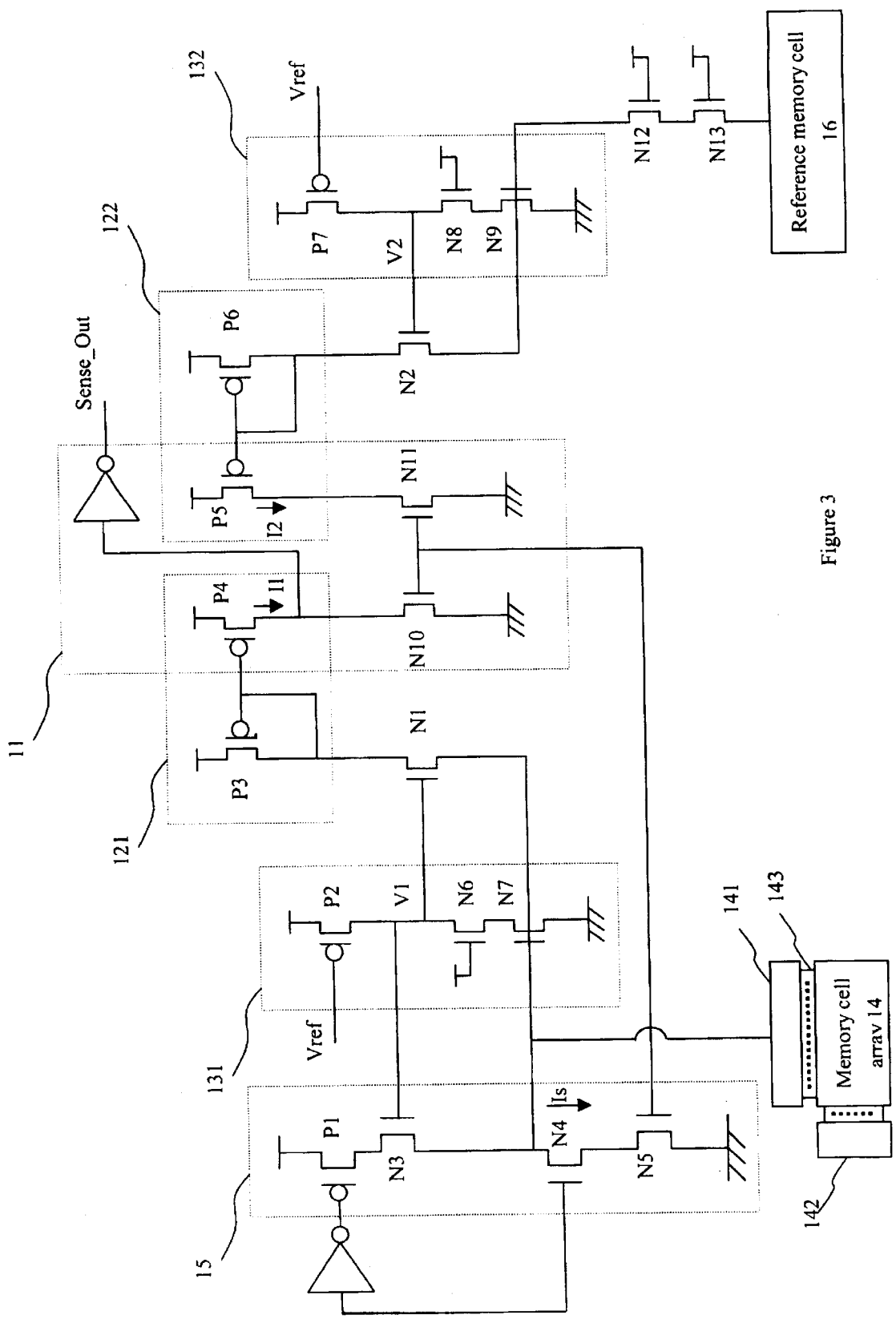
FIG. 3 is an entire circuit according to the present invention.

The dummy memory cell 16 with a low Vt (Normally conductive) is coupled to the second voltage amplifier 132. The second voltage amplifier 132 outputs the second output signal V2 to the gate of N2. The second current mirror 122 generates a second current I2 and supplies it to the comparator 11. The comparator 11 compares the first current I1 and the second current I2 and generates a sense out signal Sense_out representing the state (0 or 1) of the memory cell being accessed. FIG. 3 is a complete circuit for this preferred embodiment.

The above is only one of the preferred embodiments of the invention. This dynamic pre-charge circuit is shown in FIG. 2, which use a multiple of the dummy cell current to create this current source Is. This will have the advantage of dummy cell current and current mirror tracking.

Figure 4:
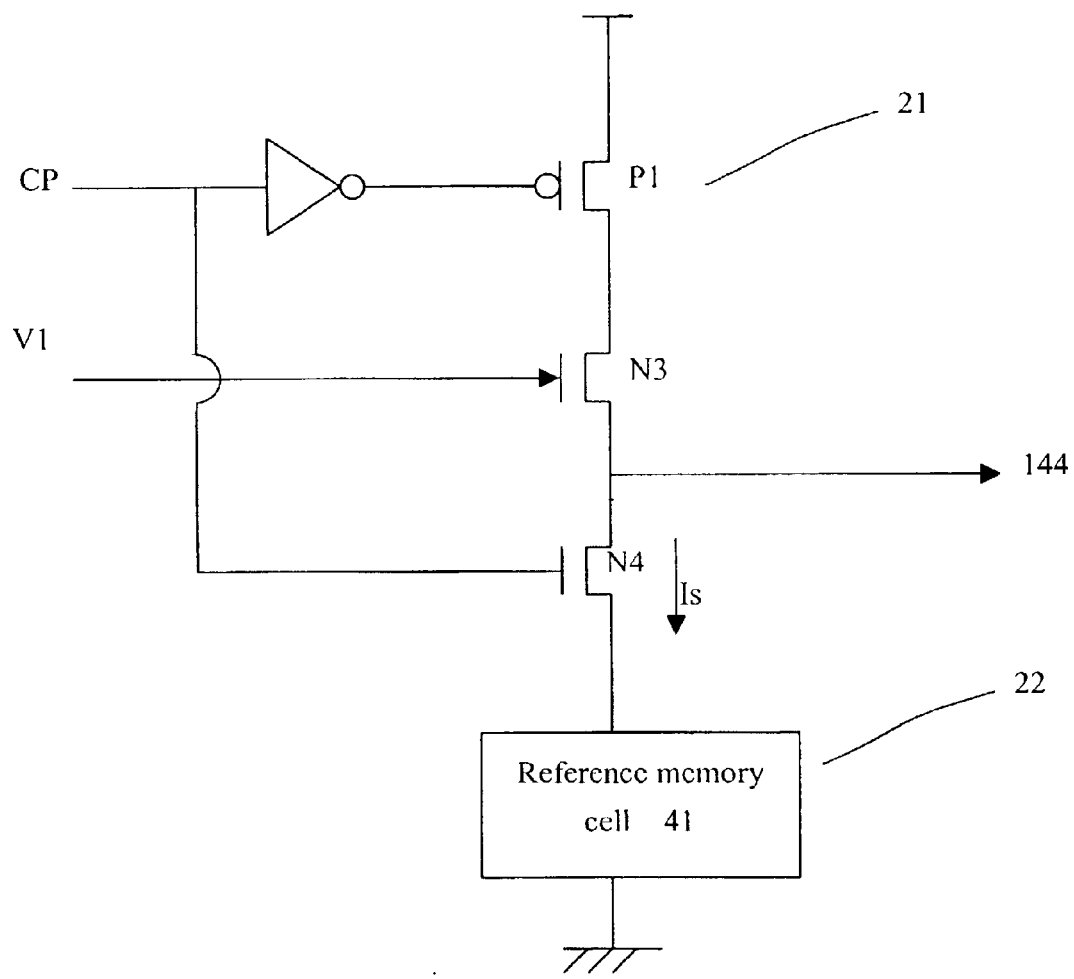
FIG. 4 is an pre-charge circuit 2 according to the present invention.
Figure 5:
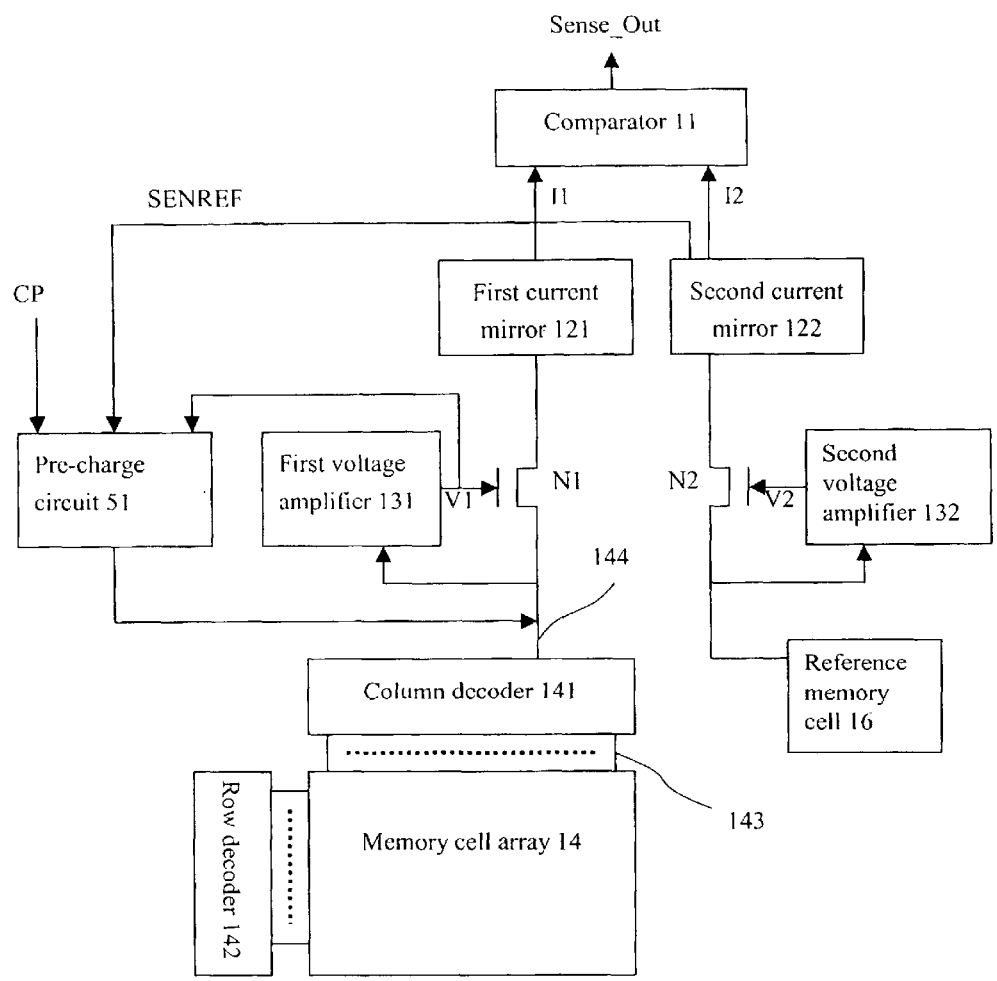
FIG. 5 is a block diagram of the FIG. 4 according to the present invention.

Another approach for this pre-charge circuit 51 (refer to FIG. 5) forms another embodiment for this current sense amplifier. Refer to FIG. 4. This current source Is can directly comes from an array of dummy cells 41.

The pulse of the pre-charge circuit can be generated by ATD (Address transient detect) circuit or any pre-determined pulse generation circuit at the beginning of read access. The duration should be limited to the following criteria:

The pulse is long enough for any bit-line in the array and sense line to converge to the operating point of the current sense amplifier.

The basic idea is to provide a pre-charge circuit with clamping mechanism during the pre-charge period to make the sense line to charge up rapidly and converge to the voltage and current operation point.

In addition to this the voltage amplifier, the current mirror being used for current sensing can also be biased to the desired current operating point.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

Attachment 1: Prior art of U.S. Pat. No. 4,713,797.
Attachment 2: Prior art of U.S. Pat. No. 5,258,669.
Attachment 3,4: Prior art of U.S. Pat. No. 5,386,158.

What is claimed is:

1. A current sense amplifier with dynamic pre-charge, comprising:
   a storage unit having a sense line;
   a voltage amplifier for generating a first output signal depending on said sense line;
   a first current mirror for generating a first current depending on said first output signal;
   a second current mirror for generating a second current depending on a reference storage unit; and
   a pre-charge circuit for generating a charge up signal on said sense line to pre-charge said sense line to an operation current level depending on said first output signal, said second current and a clock pulse so as to directly detect a data in said storage unit during detecting said sense line.

2. A current sense amplifier according to claim 1 wherein said storage unit is a memory cell.

3. A current sense amplifier according to claim 2 wherein said sense line electrically connects to a bit line of said memory cell.

4. A current sense amplifier according to claim 1 further comprising a comparison circuit for comparing said first current and said second current and outputting a data of said storage unit depending on said first current and said second current.

5. A current sense amplifier according to claim 1 wherein said second current is a reference current and said reference storage unit is a reference memory cell.

6. A current sense amplifier with dynamic pre-charge, comprising:
   a storage unit having a sense line;
   a voltage amplifier for generating a first output signal;
   a first current mirror for generating a first current depending on said first output signal;
   a pre-charge circuit for generating a charge up signal on said sense line to pre-charge said sense line to an operation current level depending on said first output signal, an internal reference current and a clock pulse so as to directly detect a data in said storage unit during detecting said sense line.

7. A current sense amplifier according to claim 6 wherein said storage unit is a memory cell.

8. A current sense amplifier according to claim 7 wherein said sense line electrically connects to a bit line of said memory cell.

9. A current sense amplifier according to claim 6 further comprising a comparison circuit for comparing said first current and said second current and outputting a data in said storage unit depending on said first current and said second current.

10. A current sense amplifier according to claim 6 wherein said internal reference current is generated from a reference storage unit of said pre-charge circuit.

* * * * *